(12) United States Patent
Robinson et al.

(10) Patent No.: US 7,173,494 B2
(45) Date of Patent: Feb. 6, 2007

(54) METHOD AND SYSTEM FOR OPERATING A FEEDBACK SYSTEM FOR A VOLTAGE CONTROLLED OSCILLATOR THAT INVOLVES CORRECTING FOR OFFSET RELATED TO THE FEEDBACK SYSTEM

(75) Inventors: Michael A. Robinson, Fremont, CA (US); Gunter Willy Steinbach, Palo Alto, CA (US); Brian Jeffrey Galloway, Campbell, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 46 days.

(21) Appl. No.: 11/039,114

(22) Filed: Jan. 20, 2005

(65) Prior Publication Data

US 2006/0158262 A1 Jul. 20, 2006

(51) Int. Cl.
*H03L 7/06* (2006.01)
(52) U.S. Cl. ............................... 331/14; 331/8; 331/17; 331/25
(58) Field of Classification Search ................ 331/1 A, 331/8, 14, 16, 17, 18, 25, 44, DIG. 2
See application file for complete search history.

(56) References Cited

U.S. PATENT DOCUMENTS

| | | | | |
|---|---|---|---|---|
| 4,410,860 A | * | 10/1983 | Kipp et al. ................. | 331/1 A |
| 5,126,692 A | * | 6/1992 | Shearer et al. ................. | 331/8 |
| 5,831,483 A | * | 11/1998 | Fukuda ......................... | 331/17 |
| 6,121,844 A | * | 9/2000 | Suzuki ......................... | 331/17 |
| 6,680,654 B2 | * | 1/2004 | Fischer et al. ................. | 331/17 |
| 6,819,188 B2 | * | 11/2004 | Yamashita ..................... | 331/17 |
| 6,937,617 B2 | | 8/2005 | Rakib et al. | |

OTHER PUBLICATIONS

Hogge, Charles R., "A self correcting clock recovery circuit," Journal of Lightwave Technology, vol. LT-3, No. 6, Dec. 1985.
Greshishchev, Yuriy, "SiGe Clock and Data Recovery IC with Linear-Type PLL for 10-Gb/s SONET Application" IEEE Journal of Solid-state Circuits, vol. 35, No. 9, Sep. 2000.
Walker, Richard C., "A 10Gb/s Si-Bipolar TX/RX Chipset for computer data transmission," SA 19.1, IEEE 1998.

* cited by examiner

*Primary Examiner*—David Mis

(57) ABSTRACT

An offset related to a feedback system for a VCO is quantified and then a parameter of the feedback system is adjusted in response to the quantified offset to correct for the offset. Correcting for offset in a feedback system can improve the performance of a PLL by reducing phase drift between the input signal and the VCO signal. The reduced phase drift can have benefits such as, for example, reduced bit errors and/or improved phase tracking accuracy.

21 Claims, 11 Drawing Sheets

Digital offset correction values

| Quantify an offset related to the feedback system that controls the VCO | ~190 |

↓

| Adjust a parameter of the feedback system in response to the quantified offset to correct for the offset. | ~192 |

METHOD AND SYSTEM FOR OPERATING A FEEDBACK SYSTEM FOR A VOLTAGE CONTROLLED OSCILLATOR THAT INVOLVES CORRECTING FOR OFFSET RELATED TO THE FEEDBACK SYSTEM

BACKGROUND OF THE INVENTION

Systems such as phase-locked loops (PLLs), frequency synthesizers, delay-locked loops, clock and data recovery circuits (CDRs), serializers/deserializers (SERDES), and data repeaters use feedback systems that include a phase detector, a charge pump, and a loop filter. These feedback systems provide precise phase control over a VCO. Typically, a feedback system is configured to ensure that the VCO accurately tracks the phase of an input signal. The accuracy of the phase tracking is affected by non-ideal performance characteristics of the feedback system components (e.g., the phase detector, the charge pump, and the loop filter). In many applications, the effects of the non-ideal performance characteristics are insignificant to the overall system performance and can be ignored. However, as performance requirements of feedback systems tighten to support, for example, higher bit rates and/or lower bit error rates, the non-ideal performance characteristics of the feedback system can become a source of error that cannot be ignored.

SUMMARY OF THE INVENTION

An offset related to a feedback system for a VCO is quantified and then a parameter of the feedback system is adjusted in response to the quantified offset to correct for the offset. Correcting for offset in a feedback system can improve the performance of a PLL by reducing phase drift between the input signal and the VCO signal. The reduced phase drift can have benefits such as, for example, reduced bit errors and/or improved phase tracking accuracy.

A method in accordance with the invention involves quantifying an offset related to the feedback system that controls the VCO and adjusting a parameter of the feedback system in response to the quantified offset to correct for the offset. Various techniques can be used to quantify the offset and to correct for the offset.

A system in accordance with the invention includes a VCO, a feedback system, an offset quantifier configured to quantify an offset related to the feedback system, and an offset corrector configured to adjust a parameter of the feedback system in response to an output from the offset quantifier.

Other aspects and advantages of the present invention will become apparent from the following detailed description, taken in conjunction with the accompanying drawings, illustrated by way of example of the principles of the invention.

BRIEF DESCRIPTION OF THE DRAWINGS

Throughout the description similar reference numbers may be used to identify similar elements.

DETAILED DESCRIPTION

The task of a PLL is to lock the phase and frequency of a VCO signal to another signal, referred to herein as an input signal. In accordance with the invention, an offset related to a feedback system for a VCO is quantified and then a parameter of the feedback system is adjusted in response to the quantified offset to correct for the offset.

Figure 1:
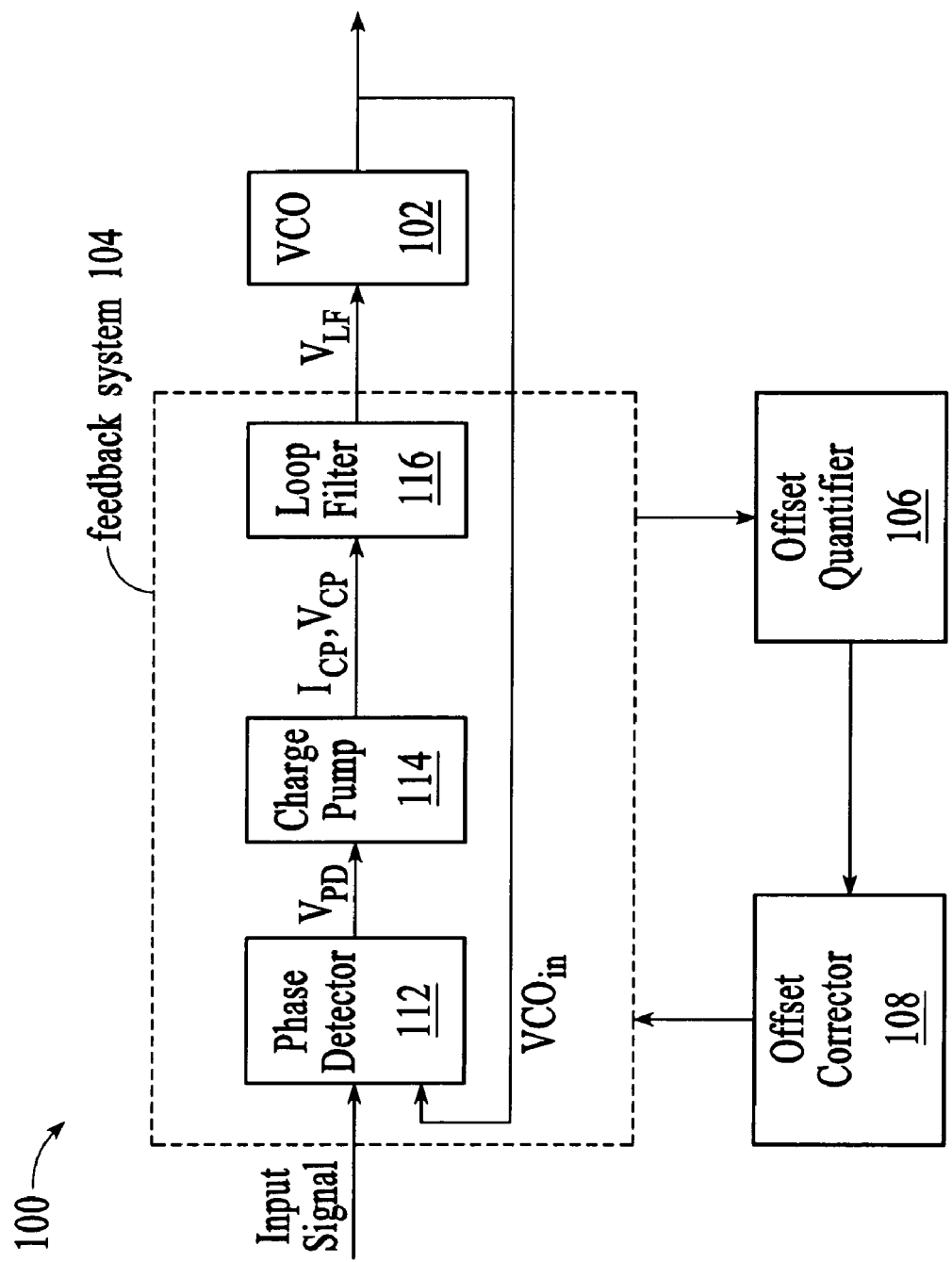
FIG. 1 depicts an offset quantifier and an offset corrector in signal communication with a PLL that includes a VCO and a feedback system.

FIG. 1 depicts an embodiment of a PLL 100 that includes a voltage controlled oscillator (VCO) 102 and a feedback system 104 for controlling the VCO. An offset quantifier 106 and an offset corrector 108 are in signal communication with the feedback system. The offset quantifier and the offset corrector are described in more detail below. The feedback system includes any combination of a phase detector 112, a charge pump 114, and a loop filter 116. For description purposes, the feedback system is described as having the phase detector, the charge pump, and the loop filter although each element may not be essential to the feedback system. The phase detector is connected to receive an input signal from a signal source and a portion of the VCO signal ($VCO_{in}$) from the VCO. In one example, the input signal is a data signal that carries clock information and data that is to be recovered. As part of the PLL operation, the phase detector compares transitions of the input signal with transitions of the VCO signal and generates an output (referred to herein as the phase detector voltage, $V_{PD}$) that is proportional to the phase difference between the input signal and the VCO signal. The phase detector produces a positive voltage when the phase of the input signal leads the phase of the VCO signal and a negative voltage when the phase of the input signal lags the phase of the VCO signal. A positive voltage ultimately increases the frequency of the VCO while a negative voltage ultimately decreases the frequency of the VCO, thereby advancing or retarding, respectively, the phase of the VCO signal.

The output from the phase detector 112 is provided to the charge pump 114. The charge pump converts the phase detector voltage ($V_{PD}$) into a charge pump current ($I_{CP}$) and charge pump voltage ($V_{CP}$).

The output from the charge pump 114 is provided to the loop filter 116. The loop filter integrates the charge pump current ($I_{CP}$) to create a loop filter voltage ($V_{LF}$) that is used to tune the frequency of the VCO 102. The output voltage that is used to tune the VCO may also be referred to herein as the VCO tuning voltage ($V_{tune}$).

Offsets in the feedback system 104 may result from non-ideal performance characteristics of the feedback system 104 components (e.g., the phase detector 112, the charge pump 114, and the loop filter 116) and/or from current leakage at, for example, component junctions or imperfect semiconductor switches. Various offsets that may affect the performance of the feedback system will be described next with reference to FIG. 1.

Referring to the phase detector 112, the phase detector outputs a phase detector voltage ($V_{PD}$) proportional to the phase difference between the input signal and the VCO signal ($VCO_{in}$). An ideal phase detector outputs a zero phase detector voltage (i.e., $V_{PD}=0$) when the phase difference between the input signal and the VCO signal is zero (i.e., two signals are perfectly aligned in phase). If the phase detector outputs a non-zero voltage in response to a zero phase difference, then that non-zero voltage represents the offset of the phase detector. In many cases, the magnitude of the phase detector offset is dependent on the transition density of the input signal, where the transition density is the fraction of symbols that transition from the previous value.

Referring to the charge pump 114, the charge pump outputs a charge pump current ($I_{CP}$) and a charge pump voltage ($V_{CP}$) that are proportional to the phase detector voltage $V_{PD}$. An ideal charge pump outputs zero charge pump current (i.e., $I_{CP}=0$) in response to a zero phase detector voltage (i.e., $V_{PD}=0$). If the charge pump outputs a non-zero charge pump current in response to a zero phase detector voltage, the non-zero charge pump current represents the offset of the charge pump.

Referring to the loop filter 116, the loop filter filters the charge pump current ($I_{CP}$) and outputs a loop filter voltage ($V_{LF}$) that is used to tune the VCO 102. An ideal loop filter outputs a constant loop filter voltage ($V_{LF}$) as long as no charge current is applied. That is, the loop filter voltage ($V_{LF}$) is constant when the applied charge pump current is zero (i.e., $I_{CP}=0$). A change in the loop filter voltage ($V_{LF}$) that occurs without the application of a charge pump current represents the offset of the loop filter.

The offset contributed from any one or combination of the feedback system 104 components and/or from current leakage will cause the phase of the input signal and the phase of the VCO signal to move apart even if the phases of the two signals are initially aligned. In accordance with the invention, an offset related to the feedback system is quantified and then a parameter of the feedback system is adjusted in response to the quantified offset to correct for offset. Correcting for offset in the feedback system improves the performance of the PLL 100 by reducing phase drift and phase offset between the two signals. The reduced phase drift and phase offset can have benefits such as, for example, reduced bit errors and/or improved phase tracking accuracy.

The offset quantifier 106 and the offset corrector 108 depicted in FIG. 1 are configured to quantify offset related to the feedback system 104 and to make an offset correction in response to the quantified offset. Offset related to the feedback system can be quantified and offset corrections can be made relative to any single component of the feedback system or relative to any combination of components of the feedback system. FIGS. 2–5 depict different logical cases 120A–120D for which offset can be quantified and offset corrections made relative to the feedback system of FIG. 1.

Figure 2:
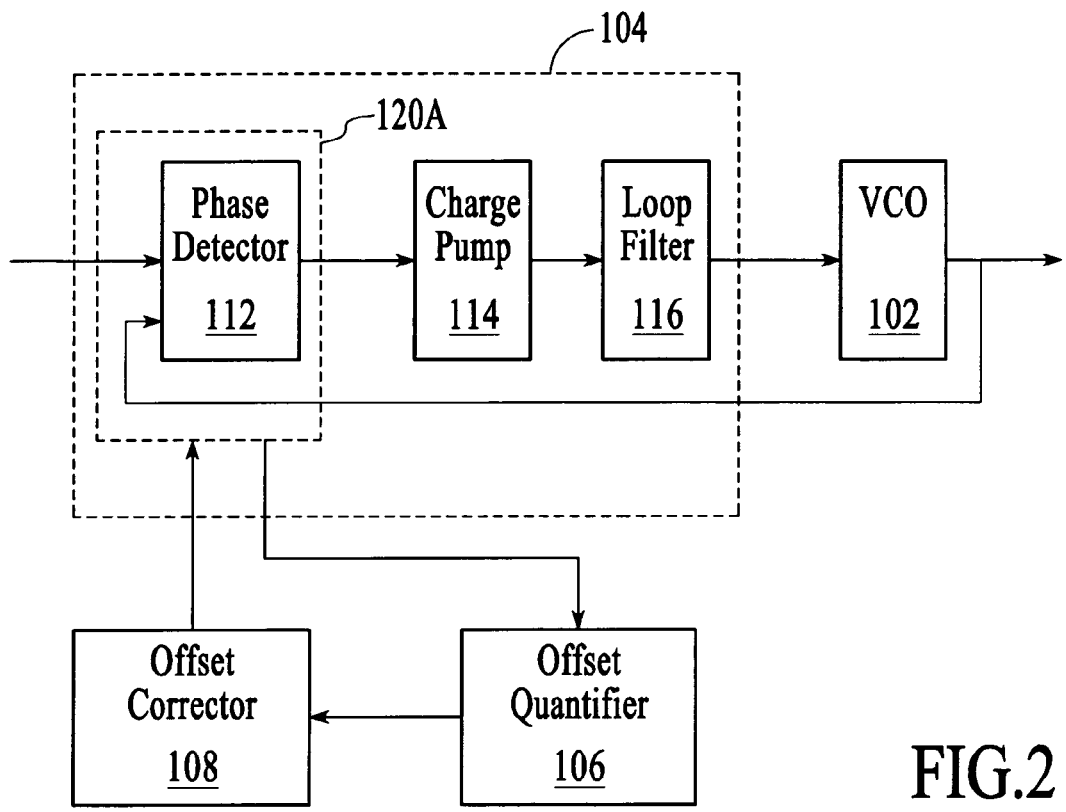
FIG. 2 depicts a configuration of FIG. 1 in which the offset of the phase detector is quantified and a parameter of the phase detector is adjusted in response to the quantified offset to correct for the offset.

FIG. 2 depicts the case 120A in which the offset of the phase detector 112 is quantified and a parameter of the phase detector is adjusted in response to the quantified offset to correct for the offset.

Figure 3:
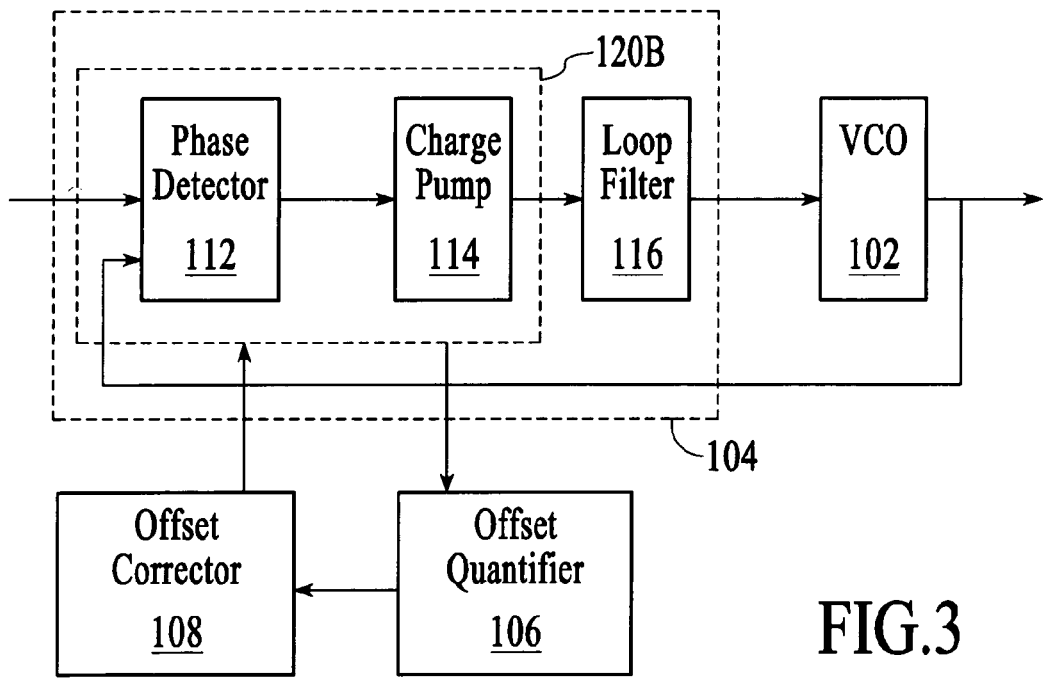
FIG. 3 depicts a configuration of FIG. 1 in which the offset of the phase detector and the charge pump are quantified in combination and a parameter of the phase detector and/or charge pump is adjusted in response to the quantified offset to correct for the offset.

FIG. 3 depicts the case 120B in which the offsets of the phase detector 112 and the charge pump 114 are quantified in combination and a parameter of the phase detector and/or charge pump is adjusted in response to the quantified offset to correct for the offset.

Figure 4:
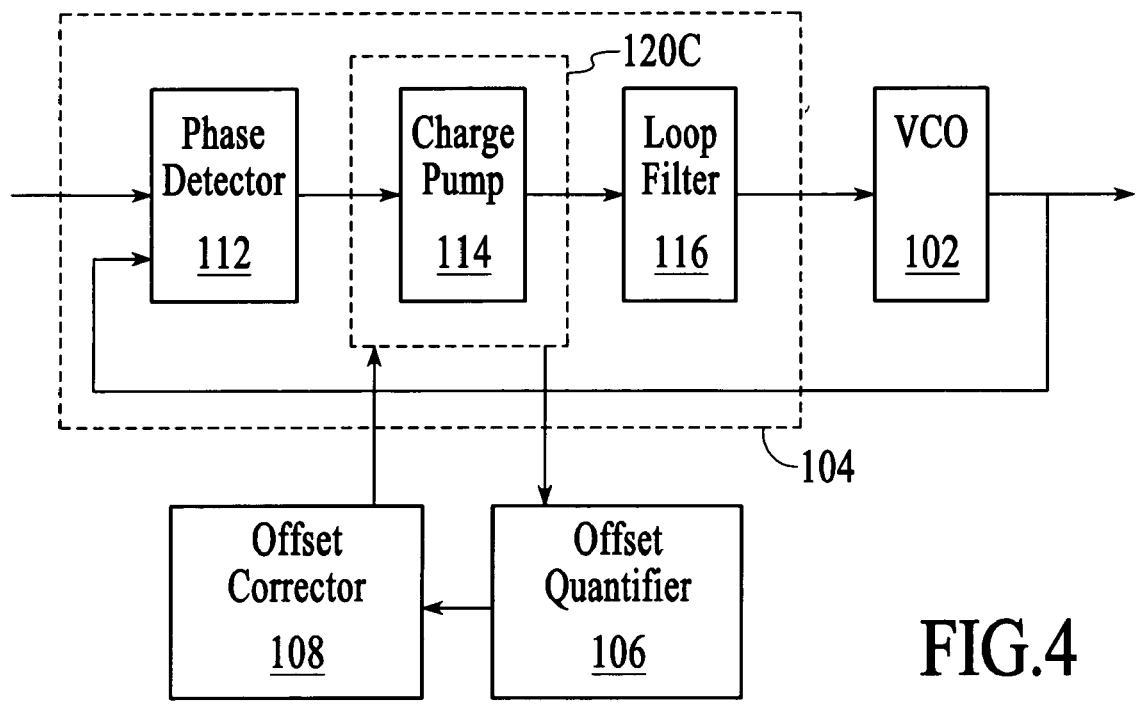
FIG. 4 depicts a configuration of FIG. 1 in which the offset of the charge pump is quantified and a parameter of the charge pump is adjusted in response to the quantified offset to correct for the offset.

FIG. 4 depicts the case 120C in which the offset of the charge pump 114 is quantified and a parameter of the charge pump is adjusted in response to the quantified offset to correct for the offset.

Figure 5:
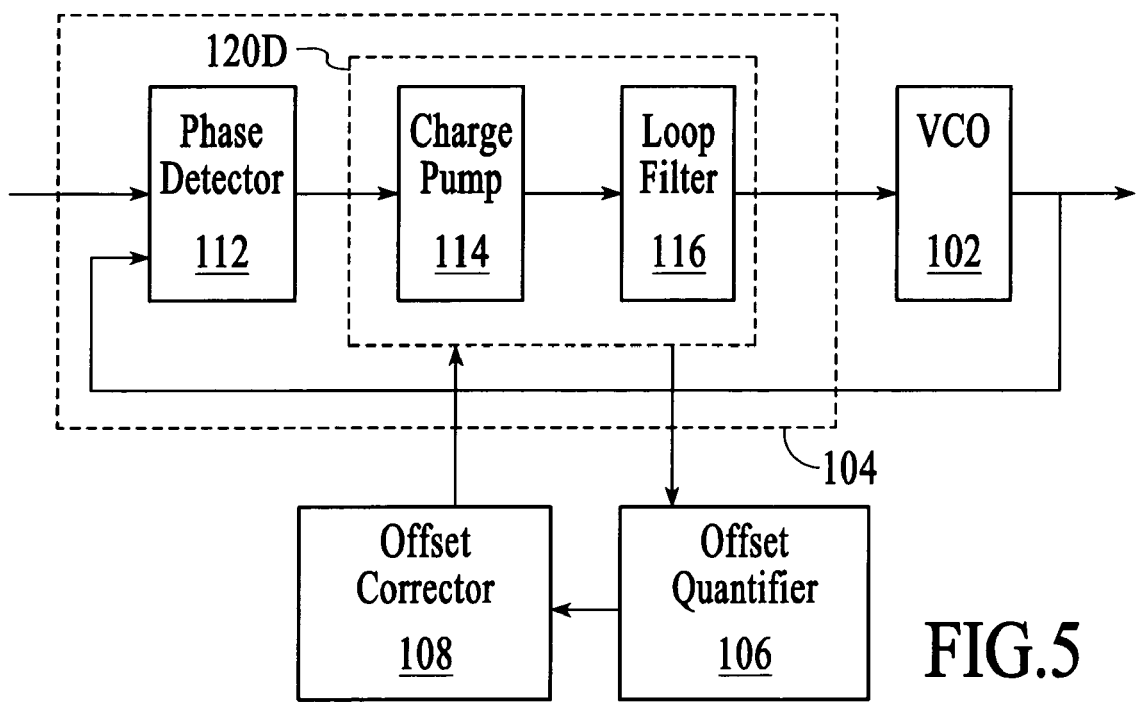
FIG. 5 depicts a configuration of FIG. 1 in which offsets of the charge pump and loop filter are quantified in combination and a parameter of the charge pump and/or loop filter is adjusted in response to the quantified offset to correct for the offset.

FIG. 5 depicts the case 120D in which the offsets of the charge pump 114 and loop filter 116 are quantified in combination and a parameter of the charge pump and/or loop filter is adjusted in response to the quantified offset to correct for the offset. Although some exemplary cases are shown in FIGS. 2–5, other cases are possible. That is, offset quantification and offset correction can be carried out on different components or different groups of components other than those described herein.

Figure 6A:
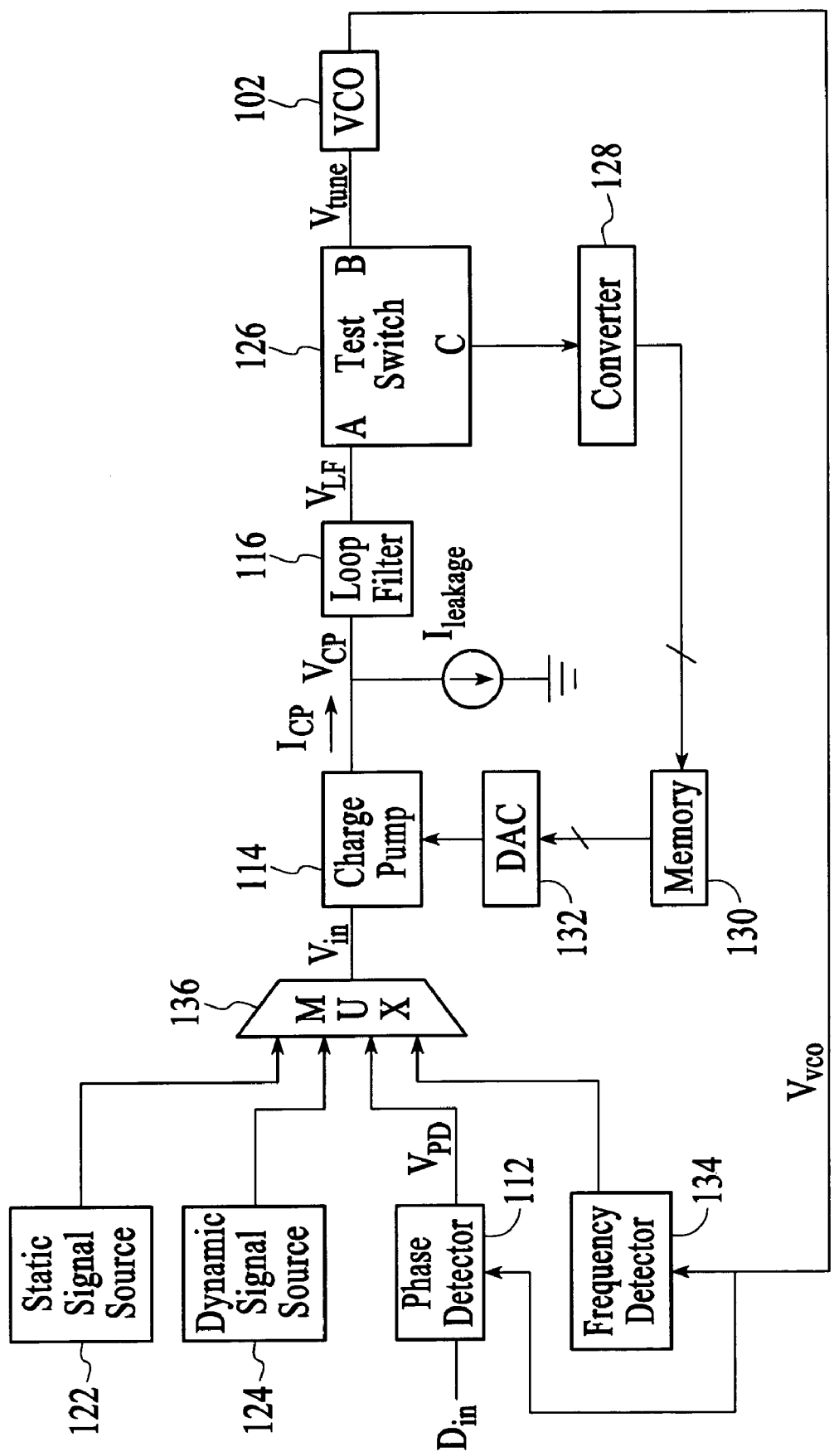
FIG. 6A depicts a PLL in signal communication with an offset quantifier and an offset corrector, where the charge pump of the PLL is adjusted through a digital-to-analog converter.

FIG. 6A depicts an embodiment of a PLL, elements of an offset quantifier, and elements of an offset corrector. The offset quantifier and offset corrector are configured to quantify the offset of the charge pump 114 and loop filter 116 in combination and to adjust a parameter of the charge pump in response to the quantified offset to correct for the offset. In the embodiment of FIG. 6A, the offset quantifier includes a static signal source 122, a dynamic signal source 124, a test switch 126, and a converter 128 and the offset corrector includes the converter, a memory 130, and a digital-to-analog converter (DAC) 132. The PLL also includes a frequency detector 134, which as described below, may be used for offset quantification.

The static signal source 122 generates a static signal that can be provided to the charge pump 114 through a multiplexer 136. A static signal may be, for example, an analog signal of a constant level (e.g., constant voltage).

The dynamic signal source 124 generates a dynamic signal that can be provided to the charge pump 114 through the multiplexer 136. The dynamic signal may be, for example, a pulsed or modulated signal with an average voltage of zero. For example, the dynamic signal may be a symmetrical square wave with a 50% duty-cycle that translates to an average voltage of zero. Although the embodiment of FIG. 6A includes both a static signal source and a dynamic signal source, alternative embodiments may include only one signal source.

Figure 7:
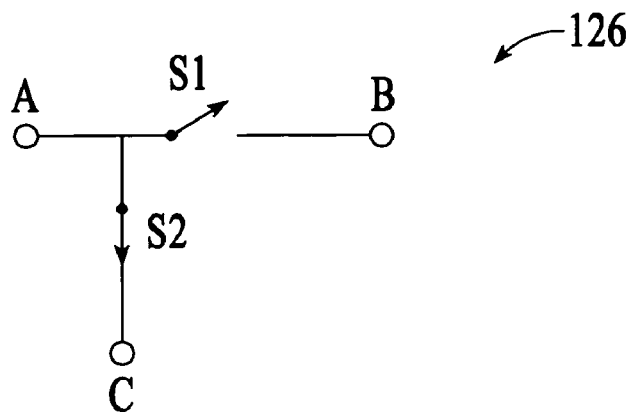
FIG. 7 depicts an embodiment of the test switch from FIG. 6 that includes two switches.

The test switch 126 enables the loop filter voltage ($V_{LF}$) to be quantified. In an embodiment, the test switch allows the loop filter voltage to be selectively diverted from the VCO 102 to the converter 128. FIG. 7 depicts an embodiment of the test switch from FIG. 6A that includes two switches, S1 and S2. When switch S1 is closed and switch S2 is open (not shown), the loop filter voltage ($V_{LF}$) is applied at node B, which is connected to the VCO. This switch state is used for normal PLL operation and is referred to herein as the "normal operating state." When switch S1 is open and switch S2 is closed (as shown in FIG. 7), the loop filter voltage ($V_{LF}$) is applied at node C, which is connected to the converter. This switch state is used for offset quantification and is referred to herein as the "offset quantification state."

Referring back to FIG. 6A, the converter 128 is configured to quantify the loop filter voltage ($V_{LF}$) and convert the quantified loop filter voltage to a digital offset correction value. The converter can quantify the loop filter voltage ($V_{LF}$) using various techniques. Some exemplary techniques are described below. The converter supports both the quantification of the offset and the parameter adjustment to correct for the offset. In support of offset correction, the converter converts the quantified loop filter voltage ($V_{LF}$) into a digital offset correction value using, for example, a comparator or an analog-to-digital converter. Although in this example the converter converts the quantified offset to a digital offset correction value, other embodiments may utilize analog signals.

The memory 130 is configured to store the digital offset correction value generated by the converter 128. The memory may include volatile memory, non-volatile memory, or fuses and will typically be only a few bits in size.

The DAC 132 is configured to adjust the charge pump 114 in response to the digital offset correction value stored in the memory 130. The resolution of the DAC (i.e., its smallest analog output increment) will determine the level of control that can be achieved.

Quantification of the charge pump 114 and loop filter 116 offset and the corresponding offset correction will be described next with reference to FIG. 6A. In operation, the test switch 126 is set to the offset quantification state and a quantification signal is provided to the charge pump. In this embodiment, the quantification signal is a predetermined signal that causes an ideal charge pump to produce no charging current (i.e., $I_{CP}=0$) and no change in the charge pump voltage ($V_{CP}$). In the example of FIG. 6A, the quantification signal is identified as $V_{in}$ and it is assumed that a zero input voltage ($V_{in}=0$) is used as the quantification signal. The quantification signal can be a static signal with a zero voltage provided from the static signal source 122 or a dynamic signal with an average voltage of zero provided from the dynamic signal source 124. With the test switch in the offset quantification state and the quantification signal applied to the charge pump, the resulting loop filter voltage ($V_{LF}$) is quantified by the converter 128. The quantified loop filter voltage ($V_{LF}$) represents the offset of the charge pump and loop filter in combination. The offset that is quantified by the converter in this configuration also includes offset that is contributed from leakage current (identified as $I_{leakage}$). The converter converts the quantified offset into a digital offset correction value. The digital offset correction value is provided to the memory 130 and then to the DAC 132. The DAC uses the digital offset correction value to adjust a parameter of the charge pump to correct for the offset. The offset correction made in this case compensates for offset that is collectively contributed by the charge pump, the loop filter, and leakage current ($I_{leakage}$). Typically, the offset correction is made with the goal of reducing or eliminating the offset. The above-described process may be performed repeatedly until the offset is corrected to a satisfactory level. The number of correction iterations (i.e., repetitions) and thus the time required for offset correction, is a function of converter complexity. For instance, as described in more detail below, a relatively simple converter may only determine the sign of the offset error and make many very small steps towards correction, but a much more complex converter may quantify the sign and magnitude of the error and calculate the amount of correction needed for a single-step correction.

Figure 8A:
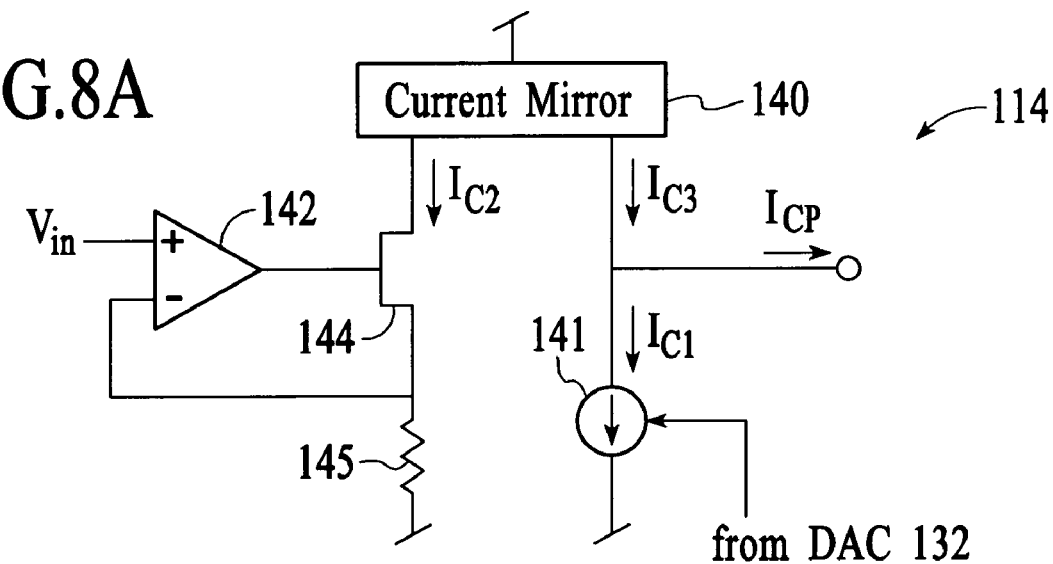
FIG. 8A depicts an example of a charge pump having an adjustable current source that enables the charge pump current to be adjusted.

As described above with reference to FIG. 6A, the offset is corrected by adjusting a parameter of the charge pump 114 to change the magnitude and sign of the charge pump current ($I_{CP}$). FIG. 8A depicts an example of a charge pump 114 that can be adjusted in response to a signal from the DAC 132 from FIG. 6A. The charge pump depicted in FIG. 8A includes a current mirror 140, an operational amplifier 142, a transistor 144, a resistor 145, and an adjustable current source 141. In operation, the charge pump current ($I_{CP}$) is adjusted by increasing or decreasing the current $I_1$ in response to a signal from the DAC.

Figure 6B:
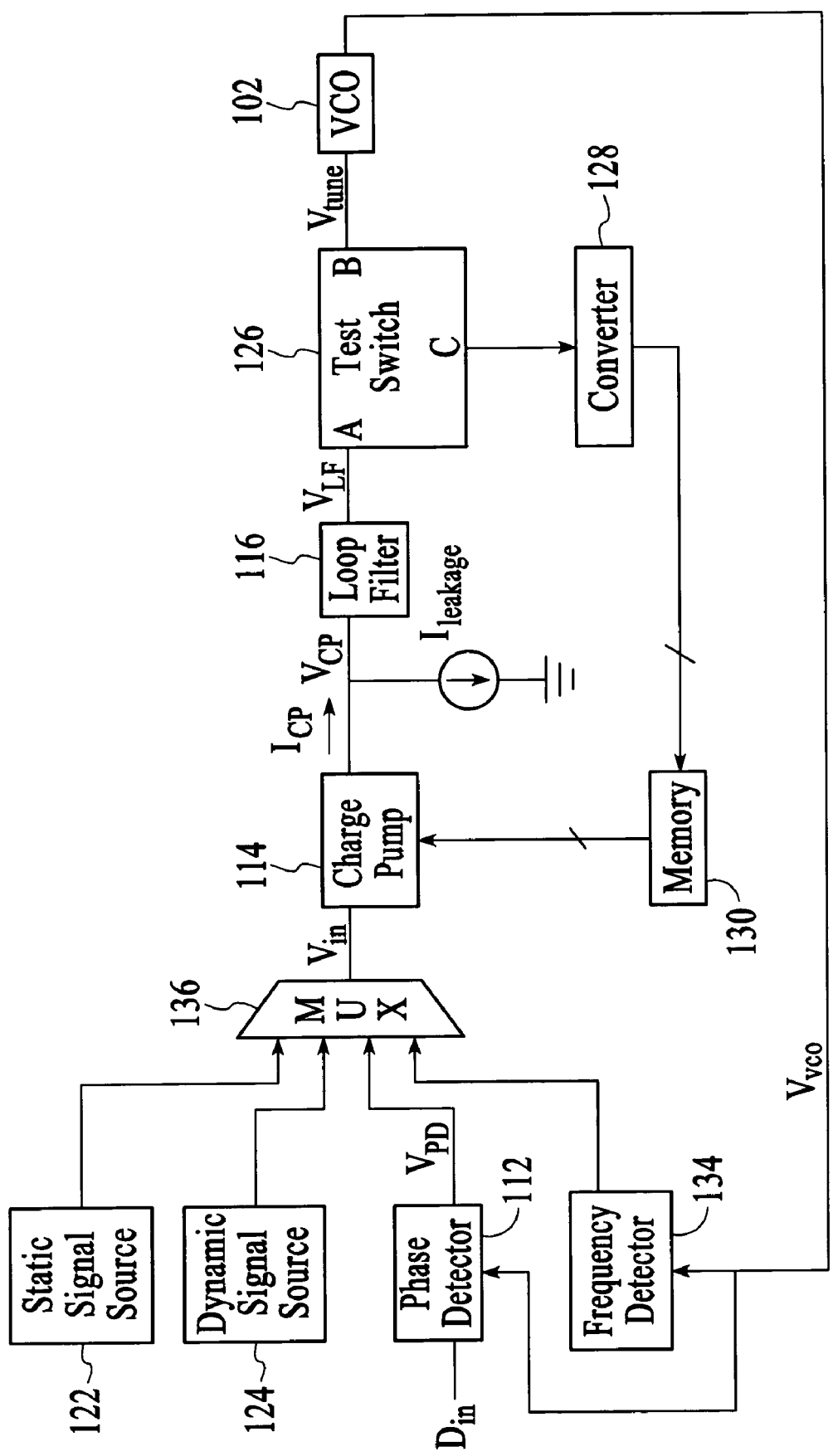
FIG. 6B depicts a PLL in signal communication with an offset quantifier and an offset corrector, where the charge pump of the PLL is adjusted directly by a digital offset correction value.
Figure 8B:
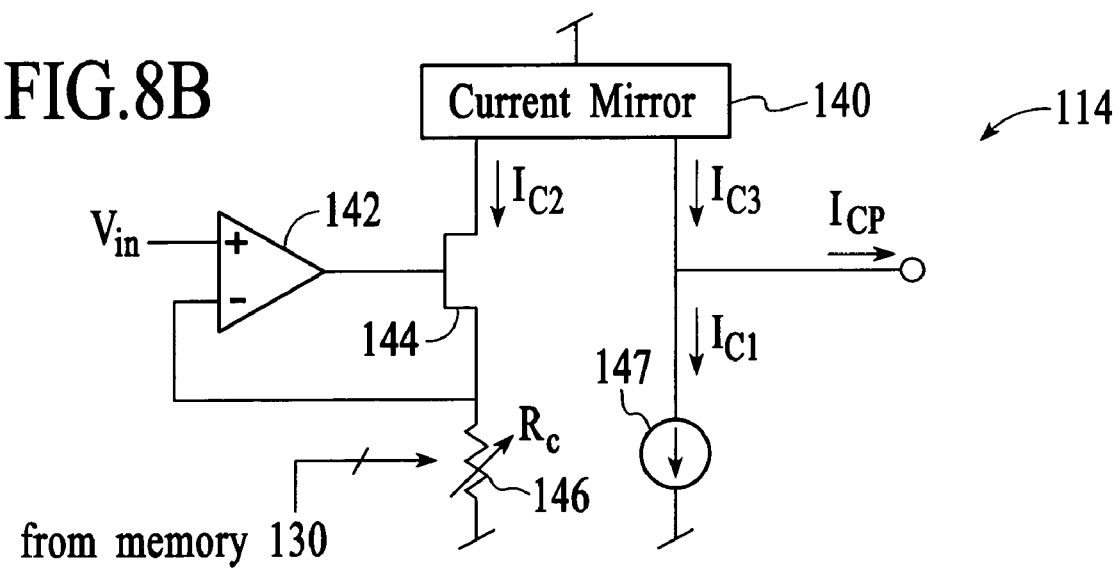
FIG. 8B depicts an example of a charge pump having an adjustable resistor that enables the charge pump current to be adjusted.

In an alternative embodiment, the charge pump 114 is adjusted in direct response to the digital offset correction value that is generated by the converter 128 and stored in the memory 130. FIG. 6B depicts an embodiment of the system of FIG. 6A in which the DAC 132 does not exist such that the charge pump is adjusted in direct response to the digital offset correction value from the memory. FIG. 8B depicts an embodiment of the charge pump from FIG. 8A with a fixed current source 147 instead of an adjustable current source and an input from the DAC. The charge pump includes an adjustable resistor 146 and a digital input directly from the memory. The adjustable resistor (which can be realized using FET switches) is controlled directly by the digital offset correction value from the memory. In operation, the charge pump current ($I_{CP}$) is adjusted by increasing or decreasing the resistance ($R_c$) of the adjustable resistor.

Regardless of the technique used to adjust the charge pump, the charge pump current is typically adjusted such that $I_{CP=B}-I_1=I_{leakage}$. Adjusting the charge pump current to be equal to the leakage current effectively cancels the two currents and maintains the loop filter voltage ($V_{LF}$) at a constant value in response to a zero input voltage ($V_{in}$).

Figure 9:
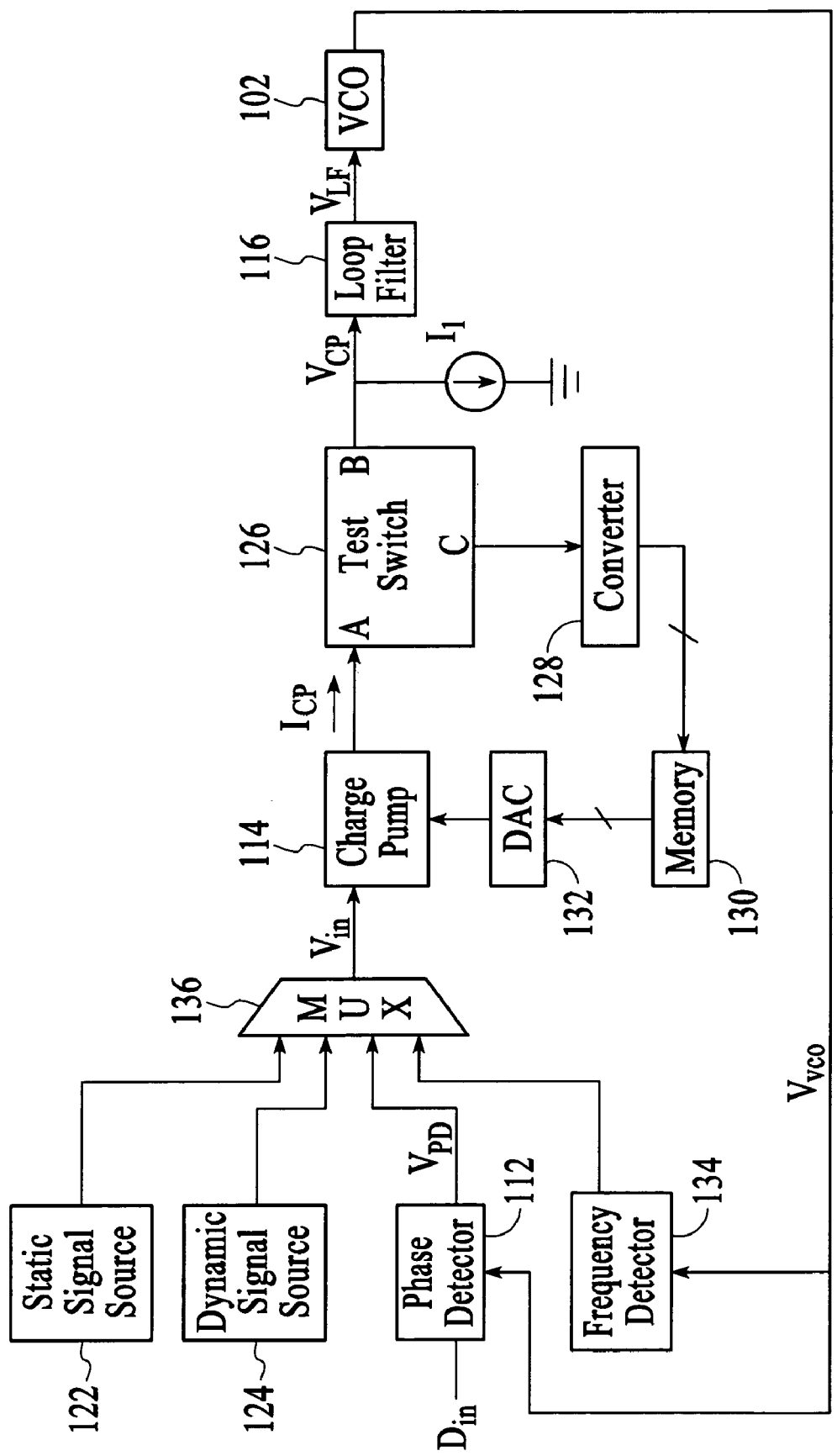
FIG. 9 depicts a PLL that is in signal communication with an offset quantifier and an offset corrector.

The systems described with reference to FIGS. 6A and 6B are configured to quantify and correct the collective offset of the combination of the charge pump 114 and the loop filter 116. FIG. 9 depicts a system that is configured to quantify and correct the offset of the charge pump only. The system of FIG. 9 is similar to the systems of FIG. 6A and 6B except that the test switch 126 is located between the charge pump and the loop filter instead of between the loop filter and the VCO 102. Operation of the system to quantify the offset and to correct for the offset is also similar to that of FIGS. 6A and 6B. In this embodiment, the charge pump current ($I_{CP}$) is quantified directly by applying a zero input voltage (i.e., $V_{in}=0$) as described above and setting the test switch to the offset quantification state. The converter 128 quantifies the charge pump current ($I_{CP}$) or the charge pump voltage ($V_{CP}$) that is generated in response to the input voltage ($V_{in}$) and then generates a digital offset correction value in response to the quantified offset. The digital offset correction value is then used to adjust a parameter of the charge pump. In this configuration, the offset contributed from leakage current ($I_{leakage}$) at the loop filter is not quantified or corrected.

Figure 10:
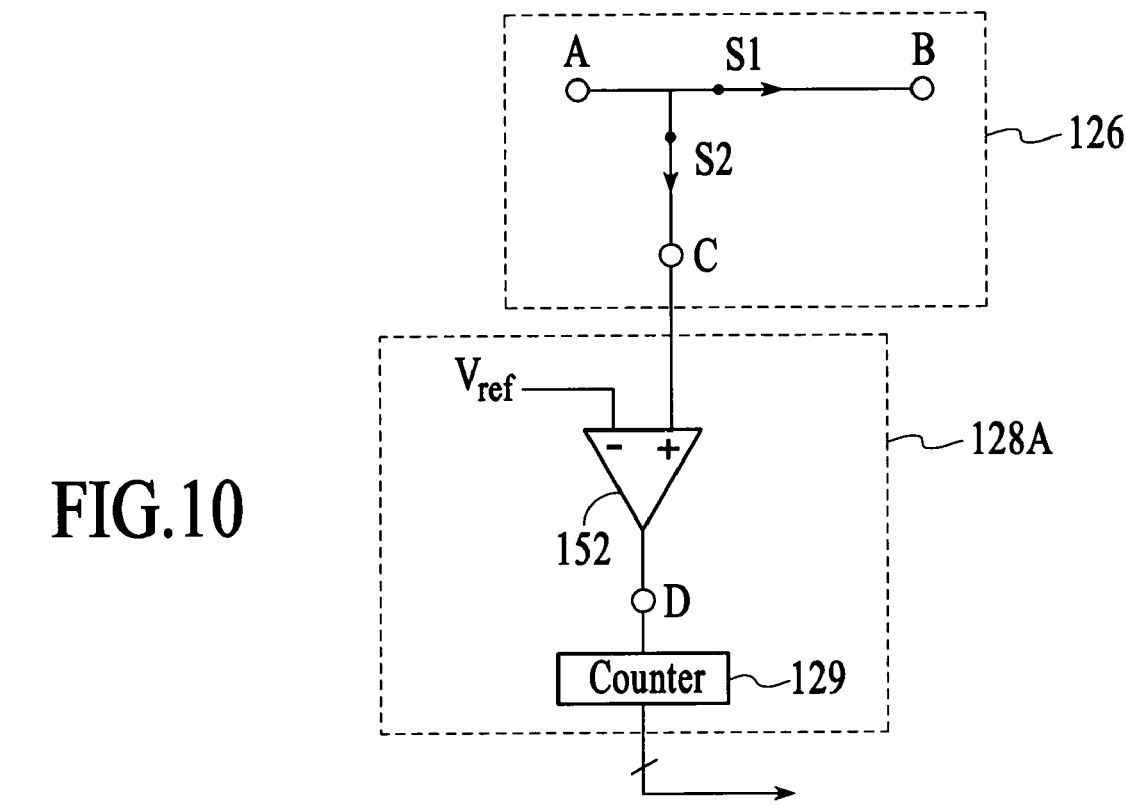
FIG. 10 depicts an embodiment of the converter from FIG. 6A, FIG. 6B, or FIG. 9 that is configured to quantify the charge pump voltage.

In an alternative embodiment, the converter 128 depicted in FIGS. 6A, 6B, and 9 may be configured to compare an output voltage to a reference voltage in order to quantify the offset. FIG. 10 depicts an embodiment of the test switch 126 and a converter 128A that includes a comparator 152 and a counter 129. The comparator has one input connected to node C (and ultimately to node A), the other input connected to a reference voltage ($V_{ref}$), and the output connected to the counter at node D. Note that in this configuration, both switches, S1 and S2, of the test switch are closed in the offset quantification state. When the converter of FIG. 10 is used in the configuration depicted in FIGS. 6A, 6B, and 9, the reference voltage ($V_{ref}$) is set somewhere between the minimum and maximum values of the charge pump voltage ($V_{CP}$). The offset of the charge pump 114 is quantified by observing the sign of the comparison, where the sign of the comparison is a function of the sign of the charge pump current ($I_{CP}$). In an embodiment, the counter counts up or down in response to the sign at output node D from positive to negative (or visa versa). The offset will be reduced due to the feedback of the system and will reach a stable or quasi-stable value in the counter after a period of time which generates a minimum charge pump offset current. This stable counter value is used as the offset correction value.

Figure 11:
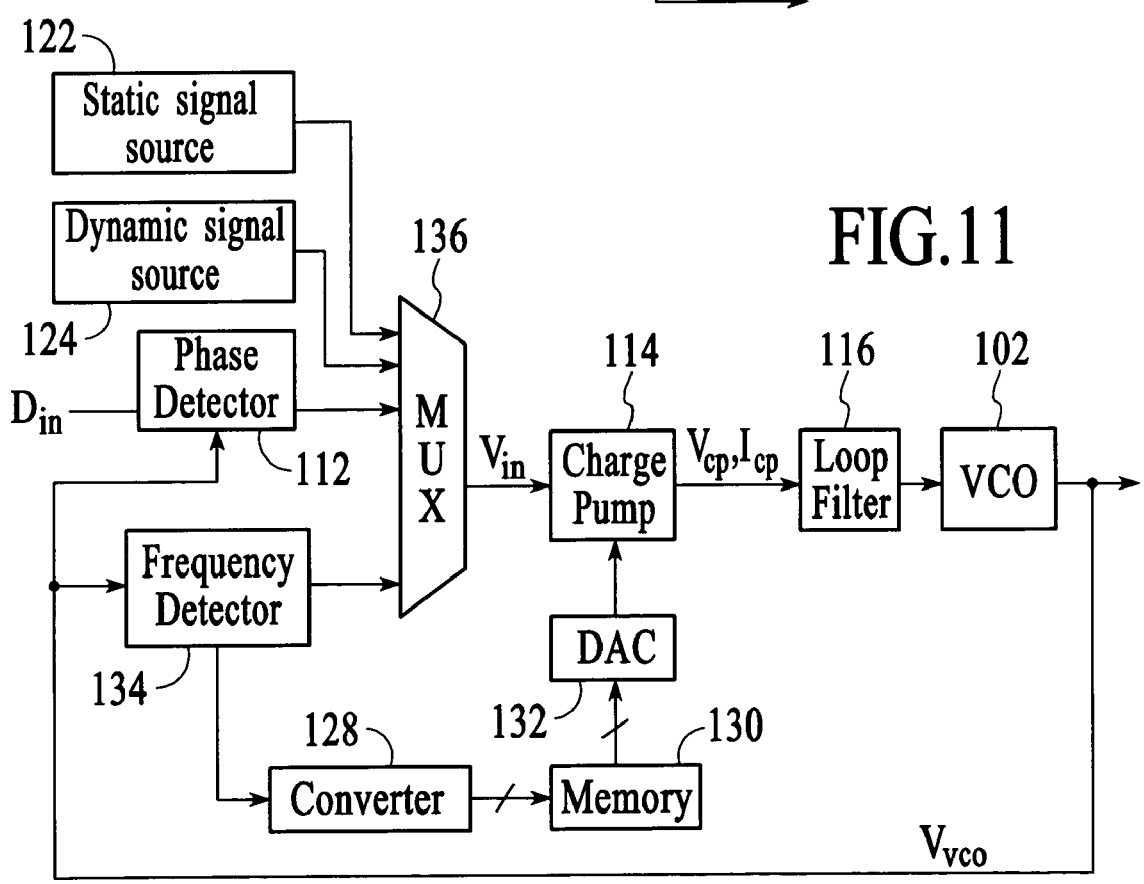
FIG. 11 depicts a PLL that includes a frequency detector, where the frequency detector is used to quantify offset in the feedback system.
Figure 12:
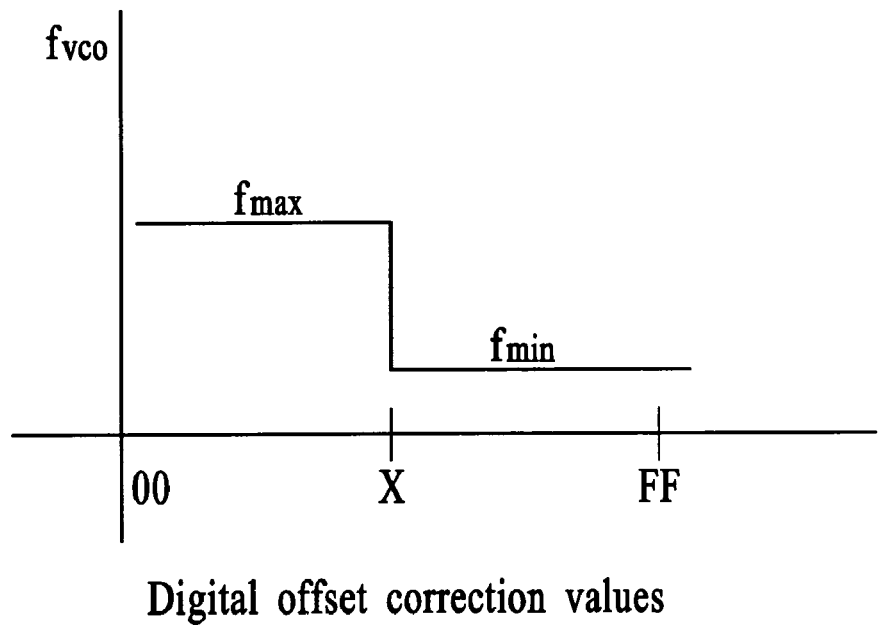
FIG. 12 depicts a graph of the VCO frequency vs. a range of digital offset correction values that illustrates the value at which the VCO frequency transitions from the maximum frequency to the minimum frequency.

In another embodiment, the offset of the feedback system 104 is quantified by measuring the frequency of the VCO signal and the quantified offset is corrected by adjusting a parameter of the charge pump 114. FIG. 11 depicts an embodiment of the PLL that includes a frequency detector 134 for measuring the frequency of the VCO 102. Frequency detectors are well known in the field and are not described in detail herein. The PLL is connected to an offset quantifier and offset corrector that include the frequency detector, a static signal source 122, a dynamic signal source 124, a converter 128, memory 130, and a DAC 132 (optional). This technique relies on the fact that when the charge pump voltage ($V_{CP}$) is at its maximum, the VCO frequency is at a maximum ($f_{max}$) and when the charge pump voltage is at its minimum, the VCO frequency is at a minimum ($f_{min}$). In operation, a quantification signal of $V_{in}=0$ is applied to the charge pump through the static signal source or the dynamic signal source. If the charge pump outputs a positive or negative current (ICP) as a result of offset, the frequency of the VCO will eventually end up at its maximum frequency or its minimum frequency because the charge pump will continue to integrate until the limit is reached. The digital offset correction value is then adjusted across a known range (e.g., by providing an external input to the converter) in order to change the frequency of the VCO from the maximum frequency to the minimum frequency. The value of the digital offset correction value at which the VCO frequency transitions from the maximum frequency to the minimum frequency or from the minimum frequency to the maximum frequency corresponds to the operating condition of the charge pump at which the difference between the charge pump current ($I_{CP}$) and the leakage current ($I_{CP}-I_{leakage}$) changes sign (i.e., passes through the desired value of zero). FIG. 12 depicts a graph of the VCO frequency vs. a range of digital offset correction values from 00 to FF that illustrates the digital offset correction value, X, at which the VCO frequency transitions from the maximum frequency to the minimum frequency. In an embodiment, the digital offset correction value at which the transition occurs is used to correct for the offset.

In another embodiment that relies on frequency measurements to quantify the offset, the loop filter voltage ($V_{LF}$) is forced to some value by, for example, setting the digital offset correction value to a desired value. The desired value can be, for example, programmed into the system or externally provided to the system. The resulting VCO frequency is measured by the frequency detector 134. The forced condition is then removed and the VCO frequency is measured again. The difference between the two measured frequencies is then determined. The sign of the frequency difference indicates the sign of the charge pump current less the leakage current ($I_{CP}-I_{leakage}$). The charge pump 114 can then be adjusted accordingly to correct for the offset of the charge pump and the leakage from the loop filter ($I_{leakage}$). The magnitude of the frequency difference between the two measurements may be utilized to determine the magnitude of the adjustments that are made to the charge pump. For example, larger initial adjustments can be made in response to relatively large frequency differences.

Figure 13:
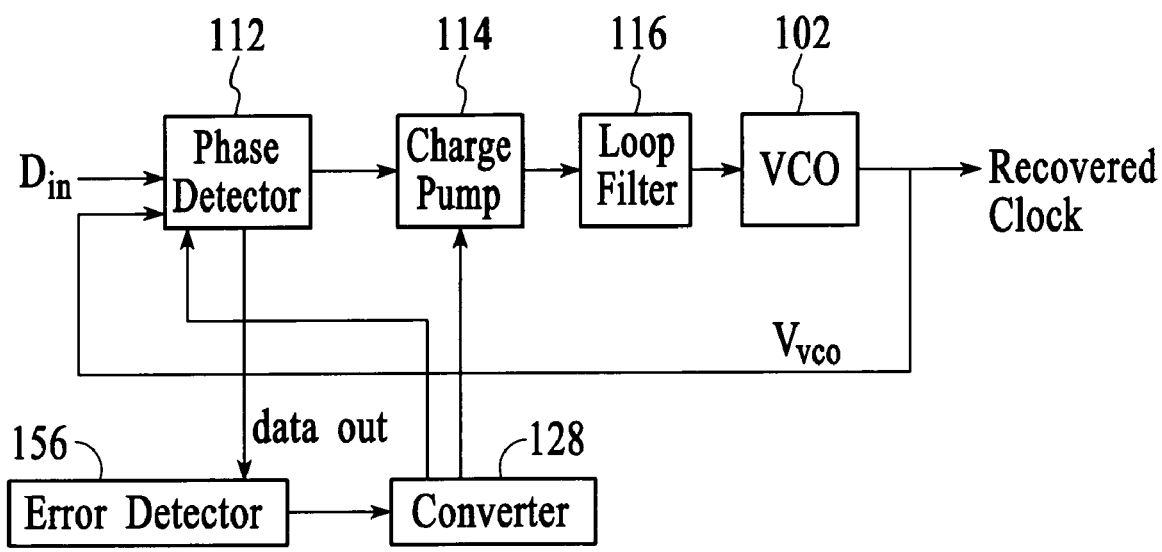
FIG. 13 depicts a PLL, an offset quantifier that is configured to measure bit errors, and a converter that is configured to adjust a parameter of the phase detector and/or the charge pump in response to the bit errors to correct for offset.
Figure 14:
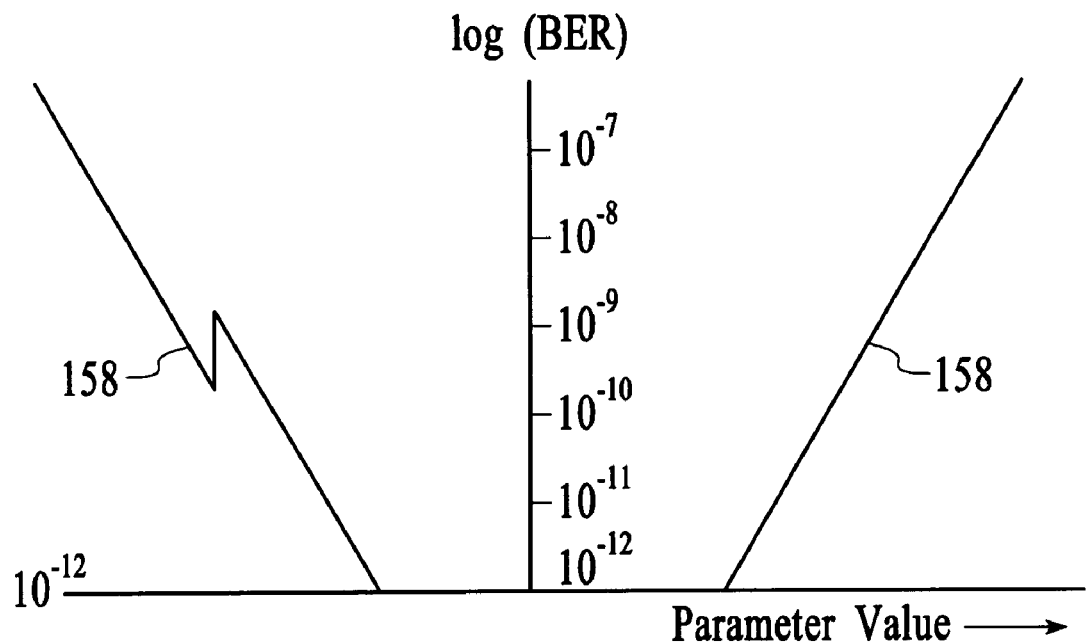
FIG. 14 depicts a graph of the BER vs. values of an adjustable parameter.

In another embodiment, the offset of the feedback system 104 is quantified by monitoring bit errors, for example, in terms of a bit error rate (BER) and a parameter of the feedback system is adjusted in response to the bit errors. FIG. 13 depicts a system that is configured to measure bit errors and to adjust a parameter of the phase detector 112 and/or the charge pump 114 in response to the bit errors to correct for the offset. The system includes an error detector 156 for quantifying bit errors and a converter 128 for adjusting a parameter of the phase detector and/or the charge pump. In operation, a parameter of the phase detector and/or charge pump is swept across a known range that causes the phase error to go from negative to zero and then to positive (or visa versa). As the parameter is swept across the range, the corresponding bit errors are measured. FIG. 14 depicts a graph of the log of the BER 158 vs. values of the adjustable parameter. To correct for the offset, the parameter is set in response to the measured bit errors. For example, the parameter is set to a value in the range where the bit errors are the lowest. This technique may be particularly well suited for correcting the offset contributed by a phase detector because generating two signals with zero phase error is quite difficult yet the errors that result from the offset in the phase detector can be relatively large.

A technique for quantifying offset in a phase detector and adjusting a parameter of the phase detector is now described with reference to FIGS. 15 and 16. Due to non-ideal performance characteristics of a phase detector, even with the phase of an input signal and the VCO signal ($VCO_{in}$) perfectly aligned, the phase detector voltage ($V_{PD}$) may be non-zero. An ideal method to quantify the offset of a phase detector is to supply an input signal and a VCO signal that have zero phase error and adjust the circuits to achieve a zero phase detector voltage ($V_{PD}$). Practically, it is quite difficult to supply two signals with perfectly aligned phase.

In some applications, significant benefit can be obtained by correcting some of the offset of the phase detector, for example, offset contributed by current source differences, resistor mismatch, or other device errors even though offsets caused by terms such as delay mismatch of different paths may not be addressed. By forcing one or a series of input conditions through input data or via special test circuits and measuring the output at $V_{in}$, some error sources and possibly the dominant ones may be adjusted in order to reduce the offset.

Figure 15:
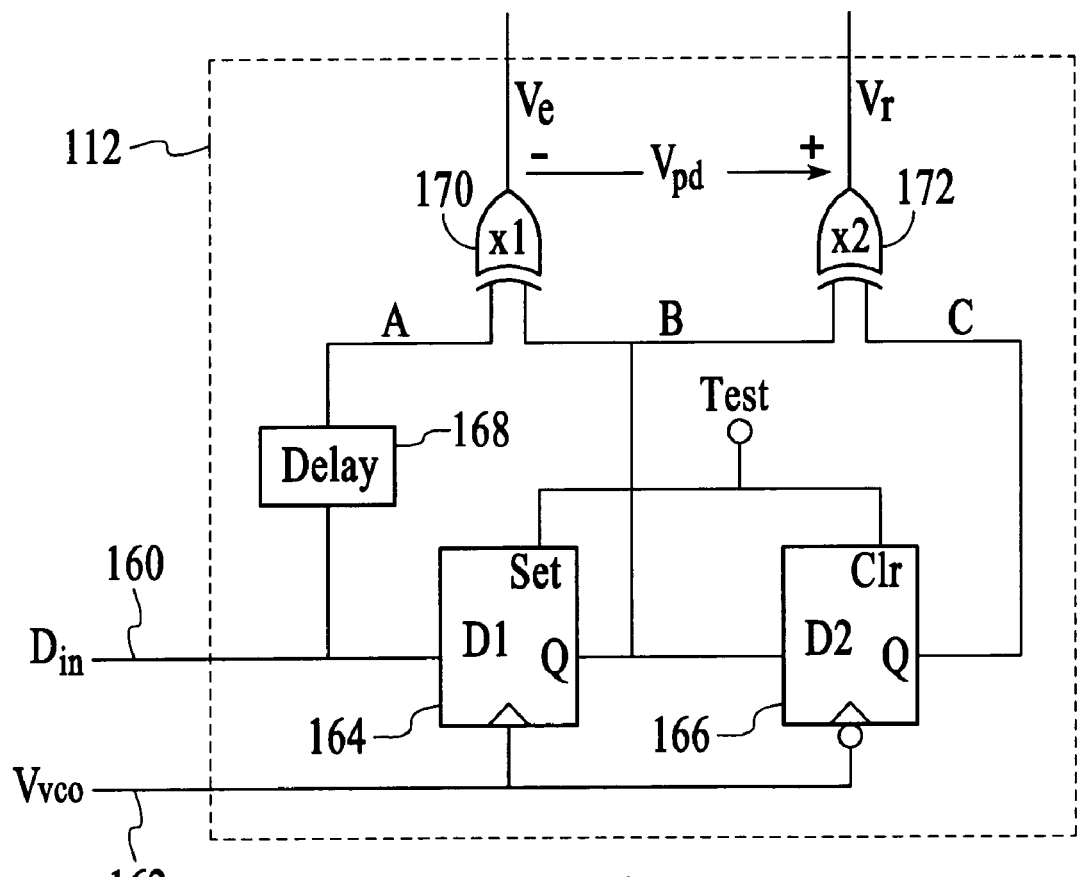
FIG. 15 depicts an embodiment of a phase detector that is configured to enable adjustment of the phase detector voltage.

FIG. 15 depicts an embodiment of a phase detector 112 that is configured to enable adjustment of the phase detector voltage ($V_{PD}$). This phase detector includes a data input 160, a VCO signal input 162, two D flip-flops (D1 and D2) 164 and 166, a delay block (DELAY) 168, and two XOR gates (X1 and X2) 170 and 172 for generating voltages $V_e$ and $V_r$. The phase detector voltage ($V_{PD}$) is the differential voltage on the output, $V_r$–$V_e$. Optional features for testing have been added including a Set input on D1, a Clr input on D2, and a Test input. In operation, if Set is high, then Q of D1 is high and if Clr is high, Q of D2 is low. A significant portion of the output offset error stems from mismatches between the XOR gates, X1 and X2. These XOR gates are configured with adjustable parameters (e.g., current sources and resistor values), which can be adjusted to correct for the offset. In an embodiment, the adjustments are made with input conditions A=B=C=0 and A=C=0 and B=1. From these values, operating parametric values are applied to the phase detector for operations use. All inputs are set to 0 by setting $D_{in}$ to a static 0 and waiting for $VCO_{in}$ to clock $D_{in}$ through D1 and D2 forcing both XOR gates to a logic 0 output. Both XOR gates are set high by keeping Data low and setting Test high which results in A=C=0 and B=1.

Figures 16, 17:
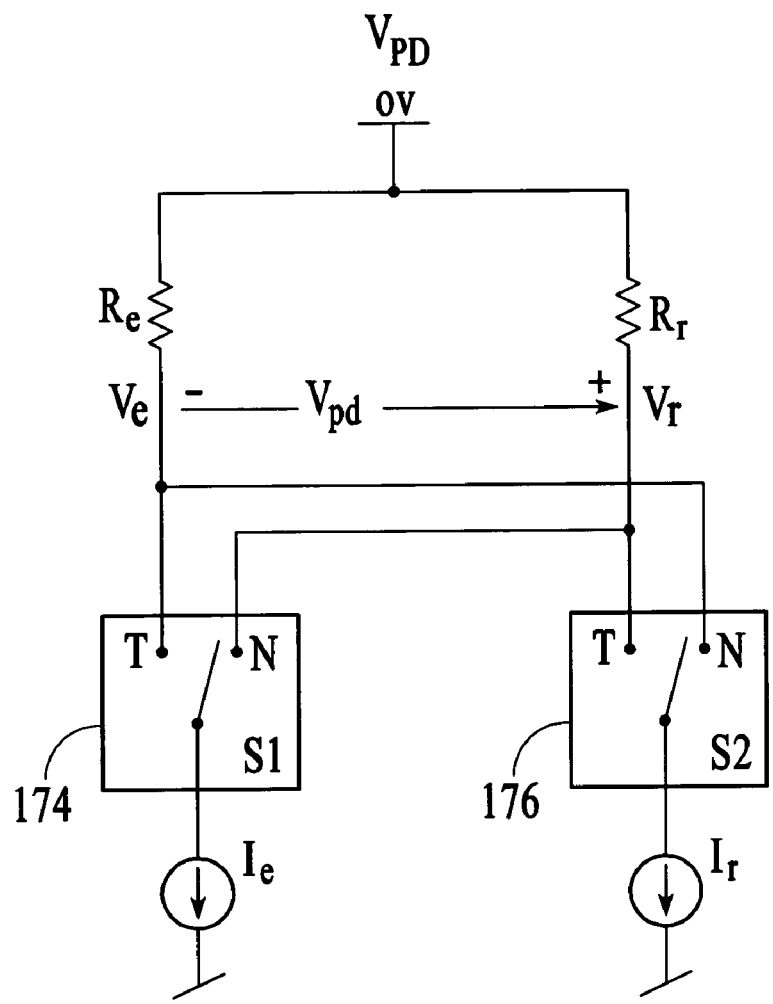
FIG. 16 depicts an embodiment of the two XOR gates from the phase detector of FIG. 15.
FIG. 17 depicts a process flow diagram of a method for operating a feedback system for a VCO in accordance with the invention.

An embodiment of the two XOR gates X1 and X2 is shown in FIG. 16 and is used for offset analysis. Referring to FIG. 16, XOR gate X1 from FIG. 15 is represented by switch S1 174 which connects the lower terminal to T when A and B (of FIG. 15) are unequal. Likewise, XOR gate X2 from FIG. 15 is represented by switch S2 176 which connects to T when B and C are unequal. With random data and ideal performance, it is expected that each switch will be in the N position 75% of the time and 25% of the time in the T position. Switches S1 and S2 are expected to be in the T position the same percentage of the time assuming that the input phase error is 0 and the components are error free. It can be shown that:

$$VR=[-I_r*(X)-I_e*(1-X)]*R_r \quad (1)$$

$$VE=[-I_e*(X)-I_r*(1-X)]*R_e \quad (2)$$

where X is the percentage of time the switch is in the T position (typically, X=0.25 for data with 50% transition density), and VR and VE represent the average voltages on nodes $V_r$ and $V_e$. By setting A, B, and C (of FIG. 15) to 0, both switches S1 and S2 are set to the N position, or equivalently X=0. For this case:

$$VR=-I_e*R_r \quad (3)$$

$$VE=-I_r*R_e \quad (4)$$

Due to offsets in the current and resistor values, these voltages may not be equal. $I_e$ is multiplied by a scale factor, k0, and k0 is varied until VR=VE (i.e., $V_{PD}$=0). In one embodiment, multiple parallel current sources are provided. The current sources are selectively enabled and disabled by series switches that are responsive to control logic. Next, as described earlier, each XOR gate is configured to generate a logic 1 output (i.e., X=1) and for this case:

$$VR=-I_r*R_r \quad (5)$$

$$VE=-I_e*R_e \quad (6)$$

Re is configured to be scalable by coefficient k1 with the goal of matching the value of $R_r$, which may be different due to mismatch. k1 is varied until the phase detector voltage equals zero ($V_{PD}$=0). In one embodiment, multiple resistors are connected in parallel and each resistor has a series switch that allows the resistor to be dropped from the parallel connection. The total resistance can be adjusted by controlling the series switches to select which resistors are dropped from the parallel connection. The scaling coefficients k0 and k1 cause $V_{PD}$=0, but only for the extreme cases X=0 and X=1. From coefficients k0 and k1, new coefficients can be calculated such that:

$$I_r=k2*I_e \quad (7)$$

$$R_r=k3*R_e \quad (8)$$

Using k2 and k3 to scale $I_e$ and $R_e$, $V_{PD}$=0 for any X and error contributions from current source and resistor mismatch have been eliminated. Using the equations above, it can be shown that:

$$I_e=I_r/(k0*k1)^{0.5} \quad (9)$$

$$R_e=R_r*(k0/k1)^{0.5} \quad (10)$$

$$k2=(k0*k1)^{0.5} \quad (11)$$

$$k3=(k0/k1)^{0.5} \quad (12)$$

It is difficult to adjust resistor values in high speed circuits without adding undesirable parasitic capacitance. Therefore, it may be advantageous to only correct the current source mismatch. As X is expected to be 0.25, the (1–X) terms dominate inside the brackets in equations (1) and (2). To reduce the errors contributed from the current source mismatch, X is set to 0 (A=B=C=0) and $I_e$ is scaled by k4. k4 is scaled until $V_{PD}$=0. Under this condition:

$$k4*I_e*R_r=I_r*R_e \quad (13)$$

Current source mismatch errors have been eliminated using the simpler method with only an adjustable current source.

The above-described technique allows mismatched components to be compensated for, thus resulting in less error for the phase detector. This technique for correcting offset can be applied to other phase detector configurations. In an alternative embodiment, the phase detector offset may be adjusted until the charge pump current ($I_{CP}$) equals zero instead of measuring the phase detector voltage ($V_{PD}$). This assumes the charge pump offset is relatively small, which, for example, may be the case if the offset in the charge pump has previously been reduced as described above.

It is desirable to have the phase detector voltage be zero (i.e., $V_{PD}$=0) when the phases of the input signal and VCO signal ($VCO_{in}$) are perfectly aligned. The phase detector voltage ($V_{PD}$) may either be directly measured through an analog multiplexer or indirectly by measuring the charge pump voltage ($V_{CP}$). Adjustments may be made to a parameter of the charge pump as described above to compensate for phase detector errors instead of adjusting the phase detector itself. In this manner phase detector errors may be compensated for with a phase detector that lacks error adjustment mechanisms.

The offset quantification and offset correction techniques described above provide for automatic correction of the offset. These techniques may be applied automatically, for example, on power-up, every time frequency lock is lost, during manufacturing, or based on conditions such as temperature or power-on hours. The offset quantification and offset correction techniques described above may alternatively be applied in response to a user request. Once the offset has been corrected, the results can be stored in the memory. As a result of the offset correction, feedback loops are generated with tighter distributions of phase errors. Additionally, manufacturing yield may be improved and hence costs may be reduced.

FIG. 17 depicts a process flow diagram of a method for operating a feedback system for a VCO in accordance with the invention. At block 190, an offset related to the feedback system that controls the VCO is quantified. At block 192, a parameter of the feedback system is adjusted in response to the quantified offset to correct for the offset.

Although offset quantification and offset correction are described with reference to linear type phase detectors, the techniques apply also to other types of phase detectors (e.g., binary or "bang-bang" type phase detectors).

Although particular examples of the offset quantifier and offset corrector are described herein, other configurations of the offset quantifier and offset corrector may be implemented without deviating from the scope of the invention.

In an embodiment, the components of the offset quantifier and the offset corrector are integrated onto the same chip as the PLL (e.g., integrated with a monolithic PLL). Alternatively, some subset of the components is integrated onto the same chip as the PLL.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A method for operating a feedback system controlling a voltage controlled oscillator (VCO), the method comprising:
  applying a quantification signal to a charge pump, wherein the quantification signal is one of a static signal of a predetermined voltage and a dynamic signal with an average voltage of a predetermined value;
  isolating an output signal that results from application of the quantification signal to the charge pump, wherein the output signal is representative of an offset of the charge pump;
  generating a digital offset correction value in response to the output signal that results from application of the quantification signal to the charge pump; and
  adjusting a parameter of the charge pump in response to the digital offset correction value to correct for offset of the charge pump.

2. The method of claim 1 wherein the static signal is a signal with zero voltage.

3. The method of claim 1 wherein the dynamic signal is a signal with an average voltage of zero.

4. The method of claim 1 wherein adjusting a parameter of the charge pump comprises adjusting a resistor as a function of the digital offset correction value.

5. The method of claim 1 wherein isolating the output signal comprises setting a test switch in an offset quantification state.

6. The method of claim 5 wherein setting the test switch in an offset quantification state comprises diverting the output signal from the VCO to a converter.

7. A phase-locked loop (PLL) system comprising:
  a voltage controlled oscillator (VCO);
  a feedback system connected to provide a tuning signal to the VCO, the feedback system comprising a charge pump;
  a quantification signal source configured to provide a quantification signal to the charge pump, wherein the quantification signal is one of a static signal of a predetermined voltage and a dynamic signal with an average voltage of a predetermined value;
  a test switch connected between the VCO and the charge pump and configured to isolate an output signal that results from application of the quantification signal to the charge pump, wherein the output signal is representative of an offset of the charge pump;
  a converter configured to generate a digital offset correction value in response to the isolated output signal from the test switch; and
  means for adjusting the charge pump in response to the digital offset correction value to correct for offset of the charge pump.

8. The PLL system of claim 7 wherein the static signal is a signal with zero voltage.

9. The PLL system of claim 7 wherein the dynamic signal is a signal with an average voltage of zero.

10. The PLL system of claim 7 further comprising a loop filter connected between the charge pump and the VCO, wherein the test switch is connected between the loop filter and the VCO such that the isolated output signal is representative of an offset of the charge pump and the loop filter.

11. The PLL system of claim 7 further comprising a loop filter connected between the charge pump and the VCO, wherein the test switch is located between the charge pump and the loop filter such that the isolated output signal is representative of an offset of the charge pump only.

12. The PLL system of claim 7 wherein the quantification signal source comprises a static signal source configured to generate the static signal.

13. The PLL system of claim 12 wherein the static signal source is configured to output a signal with zero voltage.

14. The PLL system of claim 7 wherein the quantification signal source comprises a dynamic signal source configured to generate the dynamic signal.

15. The PLL system of claim 14 wherein the dynamic signal source is configured to output a signal with an average voltage of zero.

16. The PLL system of claim 7 wherein the means for adjusting the charge pump comprises a memory for storing the digital offset correction value.

17. The PLL system of claim 16 wherein the means for adjusting the charge pump further comprises a digital-to-analog converter configured to generate an analog control signal in response to the digital offset correction value.

18. A method for operating a feedback system controlling a voltage controlled oscillator (VCO), the method comprising:
  applying a quantification signal to a charge pump, wherein the quantification signal is one of a static signal of a predetermined voltage and a dynamic signal with an average voltage of a predetermined value;

setting a test switch, which is connected between the charge pump and the VCO, to isolate an output signal that results from application of the quantification signal to the charge pump, wherein the output signal is representative of an offset of the charge pump;

generating a digital offset correction value in response to the output signal that results from application of the quantification signal to the charge pump; and adjusting a parameter of the charge pump in response to the digital offset correction value to correct for offset of the charge pump.

19. The method of claim 18 wherein the static signal is a signal with zero voltage.

20. The method of claim 18 wherein the dynamic signal is a signal with an average voltage of zero.

21. The method of claim 18 wherein adjusting a parameter of the charge pump comprises adjusting a resistor as a function of the digital offset correction value.

* * * * *